(12) United States Patent
Weltzer

(10) Patent No.: US 6,461,519 B1
(45) Date of Patent: Oct. 8, 2002

(54) PROCESS FOR PRODUCING ULTRA-PURE WATER, AND CONFIGURATION FOR CARRYING OUT A PROCESS OF THIS NATURE

(75) Inventor: Martin Weltzer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/481,637

(22) Filed: Jan. 12, 2000

(30) Foreign Application Priority Data

Jan. 12, 1999 (DE) .......................... 199 00 805

(51) Int. Cl.[7] .................................................. C02F 1/00
(52) U.S. Cl. ........................ 210/739; 210/252; 210/262; 210/900; 29/25.01; 438/905
(58) Field of Search ................................ 210/739, 252, 210/262, 900; 29/25.01; 438/905

(56) References Cited

U.S. PATENT DOCUMENTS 5,614,088 A  3/1997  Nagai et al.
6,015,493 A * 1/2000  Smith et al.
6,099,599 A * 8/2000  Wu

FOREIGN PATENT DOCUMENTS

| JP | 63-108724 A | 5/1988 |
| JP | 4-290229 A | 10/1992 |

* cited by examiner

*Primary Examiner*—Betsey Morrison Hoey
(74) *Attorney, Agent, or Firm*—Laurence A. Greenberg; Werner H. Stemer; Gregory L. Mayback

(57) ABSTRACT

A process and a configuration for producing ultra-pure water for a semiconductor manufacturing plant containing a plurality of manufacturing units. In a first purification step, untreated water undergoes preliminary purification in amounts required for the plant. In a plurality of final purification units, which are each assigned to at least one manufacturing unit, ultra-pure water of a stipulated quality is obtained from a treated water in a second purification step as a function of the process parameters of the associated manufacturing unit.

13 Claims, 1 Drawing Sheet

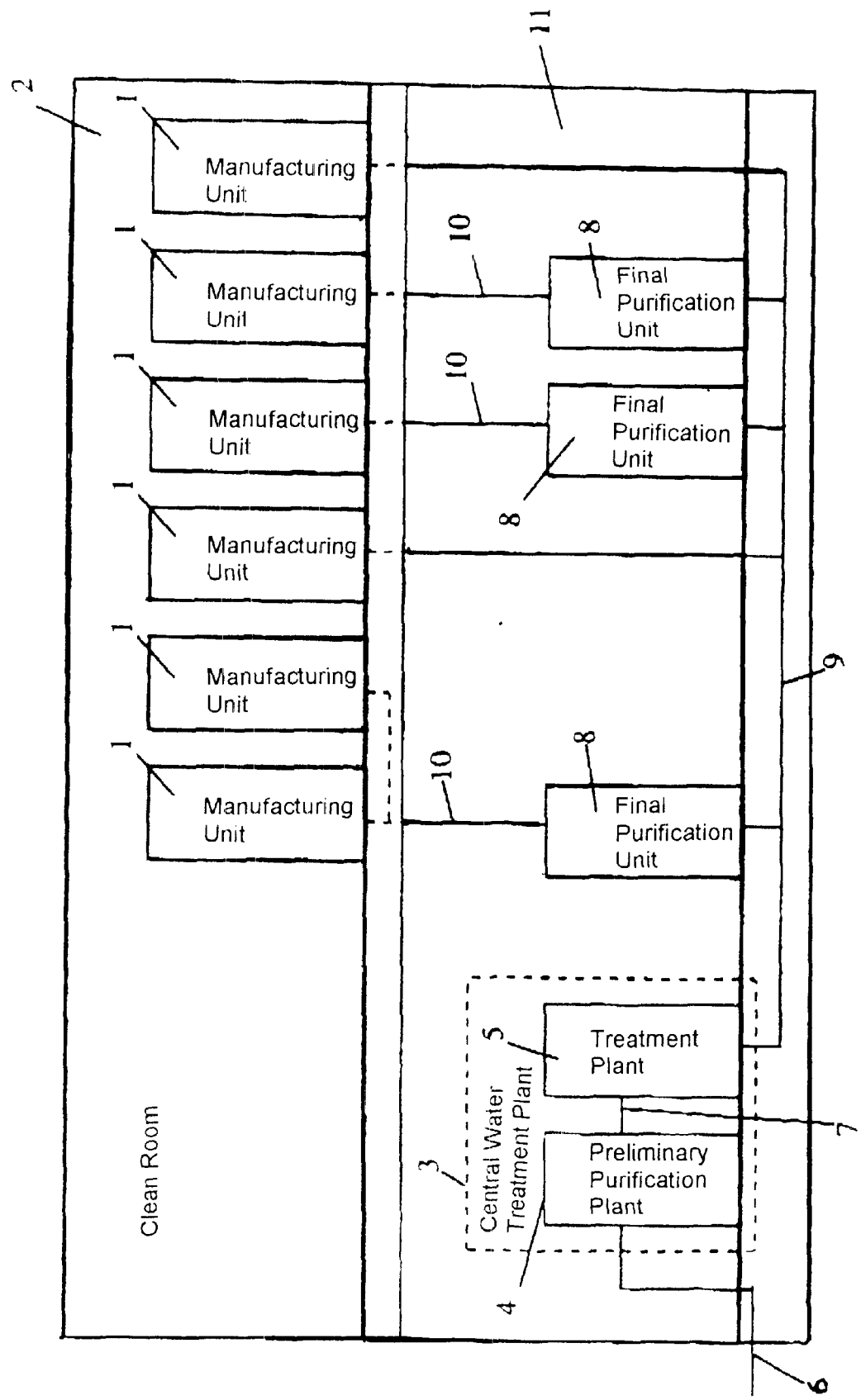

PROCESS FOR PRODUCING ULTRA-PURE WATER, AND CONFIGURATION FOR CARRYING OUT A PROCESS OF THIS NATURE

BACKGROUND OF THE INVENTION

Field of the Invention

The invention relates to a process for producing ultra-pure water for a semiconductor manufacturing plant via water treatment and purification steps and to water treatment configuration for carrying out the process.

Semiconductor manufacturing plants of this nature may be configured in particular as plants for processing wafers, in which case a plant of this nature contains a large number of manufacturing units. The individual manufacturing units form one or more process lines, a certain type of wafer processing being carried out in each of the manufacturing units.

Inter alia, large amounts of ultra-pure water are required for the processing steps carried out in the individual manufacturing units. In known semiconductor manufacturing plants, an ultra-pure water treatment plant is provided for producing the ultra-pure water. In the ultra-pure water treatment plant of this nature, the ultra-pure water is obtained in a plurality of purification steps. First, preliminary purification of untreated water takes place in a pretreatment step, the untreated water usually consisting of municipal water which is supplied from the surrounding district. As an alternative, spring water may also be used. The preliminary purification is carried out as a function of the parameters of the untreated water. Then, the water that has undergone preliminary purification is purified further in a treatment step, in which purification takes place substantially independently of the process parameters of the untreated water. This purification step alone eliminates a large proportion of the contaminants from the water. The treated water that has been obtained in this way finally undergoes final purification in a last purification step, known as polishing.

The ultra-pure water is used to supply the entire semiconductor manufacturing plant. In this case, it is preferable to provide a ring pipeline system that connects the ultra-pure water treatment plant to the individual manufacturing units of the semiconductor manufacturing plant. In the ultra-pure water treatment plant, ultra-pure water is provided in sufficient quantity and with a sufficiently high purity according to the total quantity and the purity required in the semiconductor manufacturing plant. Typical ultra-pure water parameters in this context are oxygen content, a total organic carbon (TOC) levels, a metal content and a concentration of particles and microorganisms.

Since the requirements imposed on the purity level of the ultra-pure water are extremely high yet large quantities of ultra-pure water are required, ultra-pure water treatment plants of this nature are highly complex and, in particular, also very expensive.

Japanese Patent JP 631 08 724 discloses a configuration for producing ultra-pure water, which has a central first purification step for obtaining primary pure water from untreated water. The primary pure water obtained in this way is fed to various final purification units via a plurality of feed lines, each of which units are used to produce the ultra-pure water. The ultra-pure water is fed to cleaning appliances via feed lines made from ethylene fluoride.

The decentralized production of the ultra-pure water in the final purification steps and the conveying of the ultra-pure water in feed lines made from ethylene fluoride to the cleaning appliances ensures that the quality of the ultra-pure water does not deteriorate between a final purification unit and a cleaning appliance. However, a drawback of the configuration is that large quantities of pure water are produced centrally in the purification step, and this water is supplied to the decentralized final purification steps. A further drawback is that the ultra-pure water is produced in the same quantity in the final purification steps. A configuration of this nature is correspondingly complex and expensive.

SUMMARY OF THE INVENTION

It is accordingly an object of the invention to provide a process for producing ultra-pure water, and a configuration for carrying out a process of this nature which overcome the above-mentioned disadvantages of the prior art methods and devices of this general type, in which the ultra-pure water for semiconductor manufacturing plants is produced as simply and inexpensive as possible.

With the foregoing and other objects in view there is provided, in accordance with the invention, a process for producing ultra-pure water for a semiconductor manufacturing plant having a plurality of manufacturing units, which includes:

treating an amount of untreated water required for the semiconductor manufacturing plant in a first purification stage resulting in treated water; and feeding the treated water obtained at an outlet of the first purification stage to a plurality of final purification units (8) which are each associated with at least one of the manufacturing units, the ultra-pure water being obtained from the treated water in a second purification stage in each of the final purification units, the ultra-pure water obtained in each of the final purification units undergoing final purification to a stipulated purity level in dependence on process parameters of an associated one of the manufacturing units.

The basic concept of the invention consists in providing a central water treatment plant in order to prepare the ultra-pure water for the semiconductor manufacturing plant, by use of which water treatment plant treated water is obtained from untreated water in a first purification step. Advantageously, the first purification step is subdivided into a preliminary purification (pretreatment) step followed by further treatment.

The treated water is fed to a plurality of decentralized final purification units via a pipeline system. Each of these final purification units is assigned to supply ultra-pure water to one manufacturing unit or a group of manufacturing units of the semiconductor manufacturing plant.

In each final purification unit, the ultra-pure water for the respectively associated manufacturing units undergoes final purification in accordance with the purity level required for those units on an individual basis.

Consequently, the purity level (quality) of the ultra-pure water obtained in the individual final purification units varies as a function of process parameters of the manufacturing units which are in each case assigned to a final purification unit. The purity level of the ultra-pure water produced in each final purification unit is in this case stipulated by parameters of the ultra-pure water.

Therefore, the decentralized final purification of the ultra-pure water makes it possible to precisely match the parameters of the ultra-pure water and therefore the purity level of the ultra-pure water to the different requirements in the individual manufacturing units. By comparison with a central final purification step, this considerably reduces the complexity and costs for obtaining the ultra-pure water.

This is based primarily on the fact that the ultra-pure water obtained in a central final purification step must satisfy the purity requirements of all the manufacturing units in the plant. The requirements imposed on the purity of the ultra-pure water are correspondingly high. In addition, this high-quality ultra-pure water is required in very large quantities, since it has to be fed to all the manufacturing units that need water.

By contrast, if the ultra-pure water is supplied according to the invention, only treated water is produced in the central treatment plant. obtaining treated water entails relatively little material expenditure and low costs.

Feeding the treated water to the individual final purification steps also does not involve high costs, since the requirements imposed on the materials of the pipeline system required for this purpose are low.

Finally, the final purification in each final purification step takes place only in accordance with the minimum requirements that are imposed by the process parameters of the associated manufacturing units. In some cases, these requirements may be so low that the final purification operation may even be dispensed with altogether for certain manufacturing units. This prevents ultra-pure water of very high quality being used for those manufacturing units for which ultra-pure water of lower quality would be sufficient. Other features which are considered as characteristic for the invention are set forth in the appended claims.

Although the invention is illustrated and described herein as embodied in a process for producing ultra-pure water, and a configuration for carrying out a process of this nature, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a diagrammatic, longitudinal sectional view through a semiconductor manufacturing plant with a configuration for producing ultra-pure water.

DESCRIPTION OF THE PREFERRED EMBODIMENTS

Referring now to the single FIGURE of the drawing in detail, there is shown a basic configuration of a semiconductor manufacturing plant that has a configuration for producing ultra-pure water.

The semiconductor manufacturing plant may in particular be a factory building or a complex of buildings for processing wafers. The wafers are processed in process lines with a plurality of different manufacturing units 1 which are used to carry out different manufacturing operations, such as for example etching, lithography, wet chemical, diffusion, component-cleaning processes.

The manufacturing units 1 are accommodated in clean rooms 2 or systems of clean rooms 2. For the sake of clarity, in FIG. 1 the individual manufacturing units 1 are illustrated diagrammatically in the clean room 2, the clean room 2 being located on one story of a building.

A water supply is required for each of the individual manufacturing units 1. A configuration for producing ultra-pure water is provided for this purpose. The configuration has a central water treatment plant 3.

In the water treatment plant 3, treated water is obtained from untreated water in a first purification step. In this case, the first purification step is subdivided into preliminary purification of untreated water (pretreatment) and a subsequent treatment step. Accordingly, the water treatment plant 3 contains two separate parts, a preliminary purification plant 4 and an adjoining further treatment plant 5.

Municipal water or spring water, which is fed into the preliminary purification plant 4 via a connection 6 from the domestic water mains system, is used as the untreated water. The parameters of the untreated water may vary in accordance with local conditions. The untreated water, which is fed into the treatment plant 5 with a defined quality at the outlet of the preliminary purification plant 4 via a feed line 7 or a system of feed lines, undergoes preliminary purification as a function of these parameters.

The actual principal cleaning of the water that has undergone preliminary purification takes place in the treatment plant 5. The treating takes place substantially independently of the parameters of the untreated water and also substantially independently of the requirements of use in the individual manufacturing units 1.

Ultra-pure water is obtained from the treated water in a further cleaning step that is carried out in a decentralized form in a plurality of final purification units 8. The final purification units 8 operate independently of one another and each supply one manufacturing unit 1 or a group of the manufacturing units 1 with ultra-pure water.

The final purification units 8 are connected to the treatment plant 5 via a pipeline system 9. The treated water is supplied to the final purification units 8 through the pipeline system 9. Since the purity level of the treated water is lower than that of the ultra-pure water, the requirements imposed on the material of the pipeline system 9 are correspondingly lower. Consequently, inexpensive pipes which are made in particular from PP (polypropylene) or PVC (polyvinyl chloride) can be chosen for the pipeline system 9. A high-quality, expensive pipeline system 10 only has to be used for the connections between the final purification units 8 and the associated manufacturing units 1, so that the ultra-pure water conveyed inside these connections is not contaminated. It is preferable to use PVDF pipes for the pipeline system 10.

It is particularly advantageous for the purification units 8 and the manufacturing unit 1 or the group of manufacturing units 1 which are supplied with the ultra-pure water by this purification unit 8 to be physically disposed in such a way that only a short pipeline system 10 is required between the final purification unit 8 and the associated manufacturing unit(s) 1. For this purpose, the final purification units 8 are preferably installed on the floor of a level 11 of the building that is located directly below the level on which the manufacturing units 1 are located. Starting from the final purification units 8, the PVDF pipes of the pipeline system 10 are guided through the floor of the level 11 above to the respectively associated manufacturing units 1. As illustrated in the FIGURE, the central water treatment plant 3 may be installed on the same level (floor) 11 as the final purification units 8. Since the pipeline system 10 between the final purification units 8 and the central water treatment plant 3 is of very inexpensive construction, the central water treatment plant 3 may also be located at a relatively great distance from the final purification units 8, in particular on a separate floor of the building or even in a separate building.

The capacity of the central water treatment plant 3 is such that it can be used to prepare the entire quantity of treated water that is required for the semiconductor manufacturing plant. By comparison, the capacities of the final purification units 8 are considerably smaller and are such that the manufacturing units 1 assigned to the final purification unit 8 are supplied with sufficient ultra-pure water.

According to the invention, the quality of the ultra-pure water produced in the individual final purification units 8 is not uniform. Rather, the quality of the ultra-pure water obtained in a specific final purification unit 8 is determined from the requirements imposed on the manufacturing units 1 connected thereto. Consequently, the parameters of the ultra-pure water of a final purification unit 8 are fixed by the process parameters of the associated manufacturing unit 1.

This leads to particularly efficient, inexpensive production of ultra-pure water, since the ultra-pure water does not have to be optimized with regard to parameters which are unimportant for the associated manufacturing units 1.

For example, for the process of chemical mechanical polishing (CMP), it is possible to provide the manufacturing units 1 for polishing of the wafers and further ones of the manufacturing units 1 for subsequent cleaning of the polished wafers.

The requirements imposed on the purity of the water for polishing of the wafers are low. In this case, it is merely necessary to ensure that the water used for this purpose does not exceed a certain concentration of particles of a specific minimum size. Consequently, it is possible for the manufacturing units 1 of this nature to use substantially treated water, so that in this case final purification can be dispensed with entirely or almost entirely.

By contrast, the subsequent cleaning of the polished wafers requires ultra-pure water of a higher quality. In the associated final purification unit 8, it is necessary to produce ultra-pure water that must not exceed specific concentrations of metals and anions.

Relatively high requirements are also imposed on the ultra-pure water that is used in etching processes. In this case, the ultra-pure water produced in the associated final purification unit 8 must not exceed specific concentrations of metals, anions and organic carbon (TOC).

As shown in the FIGURE, a plurality of the manufacturing units 1 may be connected to a single final purification unit 8. This is possible in particular if ultra-pure water of constant or almost constant quality is required for the individual manufacturing units 1.

It is particularly advantageous that various manufacturing units 1, as shown in the FIGURE, can be directly connected to the central water make-up plant 3 via the pipeline system 9. This is the case if the quality of the treated water is already adequate for the corresponding manufacturing units 1. For these manufacturing units 1 it is therefore possible to dispense with a final purification unit 8 entirely. Since the second purification step is therefore absent, the costs of water purification are considerably reduced. A further advantage is that the manufacturing units 1 of this nature can be connected to the central water treatment plant 3 at low cost by use of the PP pipes.

I claim:

1. A process for producing ultra-pure water for a semiconductor manufacturing plant having a plurality of manufacturing units, which comprises:
    treating an amount of untreated water required for the semiconductor manufacturing plant in a first purification stage resulting in treated water; and
    feeding the treated water obtained at an outlet of the first purification stage to a plurality of final purification units which are each associated with at least one of the manufacturing units, the ultra-pure water being obtained from the treated water in a second purification stage in each of the final purification units, the ultra-pure water obtained in each of the final purification units undergoing final purification to stipulated individual non-uniform qualities depending on different requirements in individual ones of the manufacturing units.

2. The process according to claim 1, which comprises subdividing the first purification stage into a pretreatment stage and a treating stage.

3. The process according to claim 2, which comprises purifying preliminarily the untreated water in the pretreatment stage in dependence on parameters of the untreated water resulting in preliminarily purified water, and in that the treated water is obtained in the treating stage from the preliminarily purified water.

4. The process according to claim 1, which comprises determining the stipulated purity level of the ultra-pure water produced in the final purification units by parameters of the ultra-pure water.

5. The process according to claim 4, which comprises using levels of oxygen, $SiO_2$, metals, anions, organic carbon and of particles of a stipulated minimum size in the ultra-pure water as the parameters for the ultra-pure water.

6. The process according to claim 1, which comprises connecting one of the final purification units to a group of the manufacturing units.

7. The process according to claim 1, which comprises feeding the treated water at the outlet of the first purification stage to at least one of the manufacturing units.

8. A configuration for producing ultra-pure water, comprising:
    a central water treatment plant receiving untreated water and producing treated water from the untreated water;
    a plurality of final purification units receiving the treated water and outputting the ultra-pure water, each of said final purification units to deliver the ultra-pure water to at least one manufacturing unit of a semiconductor manufacturing plant having a plurality of manufacturing units, non-uniform qualities of ultra-pure water obtained in said final purification units being adapted to different requirements of respectively associated ones of said manufacturing units; and
    a pipeline system connecting said central water treatment plant to said final purification units for transporting the treated water to said final purification units.

9. The configuration according to claim 8, wherein said central water treatment plant has a preliminary purification plant for carrying out a preliminary purification and a further treatment plant connected to said preliminary purification plant and outputting the treated water.

10. The configuration according to claim 8, wherein said pipeline system for transporting the treated water to said final purification units has pipes selected from the group consisting of polypropylene (PP) pipes and polyvinyl chloride (PVC) pipes.

11. The configuration according to claim 8, including a further pipeline system formed of PVDF pipes connecting said final purification units to the manufacturing units for transporting the ultra-pure water to the manufacturing units.

12. A semiconductor manufacturing plant, comprising:
    a building having multiple levels and a clean room;
    a central water treatment plant disposed in said building, said central water treatment plant receiving untreated water and producing treated water from the untreated water;

a plurality of final purification units disposed in said building on a level below said clean room; said final purification units receiving the treated water and producing ultra-pure water out of the treated water;

a pipeline system connecting said central water treatment plant to said final purification units for transporting the treated water to said final purification units;

a plurality of manufacturing units disposed in said clean room, each of said final purification units delivering the ultra-pure water to at least one of said manufacturing units, a purity level of the ultra-pure water obtained in said final purification units adapted to process parameters of a respectively associated manufacturing unit.

13. The semiconductor manufacturing plant according to claim 12, wherein said final purification units are disposed directly below said manufacturing units.

* * * * *